United States Patent
Chidambarrao et al.

(10) Patent No.: US 7,224,021 B2
(45) Date of Patent: May 29, 2007

(54) MOSFET WITH HIGH ANGLE SIDEWALL GATE AND CONTACTS FOR REDUCED MILLER CAPACITANCE

(75) Inventors: Dureseti Chidambarrao, Weston, CT (US); Lawrence A. Clevenger, Lagrangeville, NY (US); Omer H. Dokumaci, Wappingers Falls, NY (US); Kaushik A. Kumar, Beacon, NY (US); Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/162,424

(22) Filed: Sep. 9, 2005

(65) Prior Publication Data

US 2007/0057334 A1    Mar. 15, 2007

(51) Int. Cl.
*H01L 29/76* (2006.01)
(52) U.S. Cl. ............... 257/327; 257/412; 257/368; 257/408; 257/409; 257/E21.574; 257/E27.029
(58) Field of Classification Search .............. None
See application file for complete search history.

(56) References Cited

U.S. PATENT DOCUMENTS

| 4,182,023 | A |   | 1/1980 | Cohen et al. |
| 4,394,182 | A | * | 7/1983 | Maddox, III ........... 438/163 |
| 4,675,715 | A | * | 6/1987 | Lepselter et al. ......... 257/51 |
| 6,531,724 | B1 | * | 3/2003 | Furukawa et al. ......... 257/288 |
| 6,858,903 | B2 |   | 2/2005 | Natzle et al. |

OTHER PUBLICATIONS

Bana "A Method for Estimating Overlap Capacitance in Mosfet Devices by DC Current Measurement", http://sunsite.berkeley.edu/TechRepPages/ERL-93-77, last update Mar. 3, 2005, pp. 1-2.
"MOS Field-Effect Transistor", http://qucs.sourceforge.net/tech/node29.html; last update Mar. 3, 2005; pp. 1-13.

* cited by examiner

*Primary Examiner*—Leonardo Andujar
*Assistant Examiner*—Scott R. Wilson
(74) *Attorney, Agent, or Firm*—Scully, Scott, Murphy & Presser, P.C.; Joseph P. Abate, Esq.

(57) ABSTRACT

The present invention relates to an FET device having a conductive gate electrode with angled sidewalls. Specifically, the sidewalls of the FET device are offset from the vertical direction by an offset angle that is greater than about 0° and not more than about 45°. In such a manner, such conductive gate electrode has a top surface area that is smaller than its base surface area. Preferably, the FET device further comprises source/drain metal contacts that are also characterized by angled sidewalls, except that the offset angle of the source/drain metal contacts are arranged so that the top surface area of each metal contact is larger than its base surface area. The FET device of the present invention has significantly reduced gate to drain metal contact overlap capacitance, e.g., less than about 0.07 femtoFarads per micron of channel width, in comparison with conventional FET devices having straight-wall gate electrodes and metal contacts.

12 Claims, 4 Drawing Sheets

MOSFET WITH HIGH ANGLE SIDEWALL GATE AND CONTACTS FOR REDUCED MILLER CAPACITANCE

The present invention relates to an improved field effect transistor (FET), and more particularly to an improved metal-oxide-semiconductor field-effect transistor (MOSFET), having a gate structure with angled sidewalls for reduction of gate-to-source/drain overlap capacitance, and methods for fabricating such an FET device.

BACKGROUND OF THE INVENTION

In the semiconductor industry, there is a constant demand to increase the operating speed of integrated circuits (ICs). This increased demand is fueled by the need for electronic devices such as computers to operate at increasingly greater speeds. The demand for increased speed, in turn, has resulted in a continual size reduction of the semiconductor devices. Specifically, the channel length, junction depths, and/or gate dielectric thickness of field effect transistors (FETs) are reduced. Thus, there is a constant drive to reduce the size, or scale, of the components of a typical FET to increase the overall speed of the FET. Additionally, reducing the size, or scale, of the components of a typical FET also increases the density and number of FETS that can be fabricated on a given single semiconductor wafer.

However, reducing the channel length of a transistor also increases "short-channel" effects, as well as "edge effects" that are relatively unimportant in long channel transistors. Short-channel effects include, among other things, an increased source/drain (S/D) leakage current when the transistor is switched "off". One of the edge effects that may influence transistor and circuit performance is known as the total gate-to-drain and gate-to-source capacitance. Gate-drain capacitance is also known as "Miller capacitance" due to a Miller multiplication factor, which increases the capacitance by a factor related to the voltage gain of a transistor. The Miller multiplication further increases the parasitic gate-to-drain capacitance that slows down circuits. As is known to those skilled in the art, a significant portion of gate-to-drain and gate-to-source or Miller capacitance is an overlap capacitance that arises between the gate conductor and the S/D metal contact.

Coupled with the Miller effect, this overlap capacitance contributes significantly to the overall switching capacitance, which in turn reduces the operation speed of the device.

Therefore, there is a continuing need for reducing the gate-to-source/drain metal contact capacitance in FET devices.

SUMMARY OF THE INVENTION

In one aspect, the present invention relates to an FET device, more preferably a (MOSFET), with significantly reduced gate-to-source/drain overlap capacitance. Such an FET device contains angled sidewalls that are characterized by an offset angle that is greater than about 0° and not more than about 45° with respect to a vertical direction.

The term "vertical" as used herein refers to a direction that is normal or perpendicular to the top surface of a semiconductor substrate.

In general terms, the present invention relates to an FET device that comprises:

a semiconductor substrate containing source and drain regions;

a gate dielectric layer located on a top surface of the semiconductor substrate; and a conductive gate electrode located on the gate dielectric layer, wherein the conductive gate electrode has a top, a base, and sidewalls, wherein the sidewalls of the conductive gate electrode are offset from a vertical direction by an offset angle that is greater than about 0° and not more than about 45°, so that the top of said conductive gate electrode has a surface area smaller than that of the base.

The offset angle is preferably between about 5° and about 30°, and more preferably between about 10° and about 20°.

The FET device of the present invention preferably further comprises any of the following structures: source extension and drain extension regions in the semiconductor substrate, source/drain spacers along the sidewalls of the conductive gate electrode, metal silicide conductors for the gate electrode, the source region, and the drain region, and a capping layer over the conductive gate electrode, the source region, and the drain region.

Preferably, the FET device of the present invention further comprises metal contacts with angled or offset sidewalls for the source and drain regions. The sidewalls of each metal contact are characterized by offset angles that are larger than 0° but not more than 45° away from the vertical direction, so that the top surface area of the metal contact is larger than its base surface area.

The FET device of the present invention has significantly reduced overlap capacitance, in comparison with conventional FET devices having straight-wall gate electrodes. The gate to source metal contact or gate to drain metal contact overlap capacitance of the FET devices is preferably less than 0.07 femtoFarads per micron of channel width.

In a further aspect, the present invention relates to a method for fabricating the FET device described hereinabove, comprising:

forming a gate dielectric layer over a semiconductor substrate;

forming a gate conductor layer over the gate dielectric layer;

selectively patterning the gate conductor layer to form a conductive gate electrode that has a top, a base, and sidewalls, wherein the sidewalls of the conductive gate electrode are offset from a vertical direction by an offset angle that is greater than about 0° and not more than about 45°, so that the top of the conductive gate electrode has a surface area smaller than that of the base; and forming source and drain regions in the semiconductor substrate.

Preferably, but not necessary, the conductive gate electrode with angled or offset sidewalls is formed by a reactive ion etching (RIE) process.

Further, the above-described method may comprise additional processing steps for forming any of the following structures: source and drain extension regions in the semiconductor substrate (which are preferably formed before the source and drain regions), source/drain spacers along the sidewalls of the conductive gate electrode (which are also preferably formed before the source and drain regions), metal silicide conductors for the gate electrode and the source/drain regions, and a capping layer over the conductive gate electrode and the source/drain regions.

Other aspects, features and advantages of the invention will be more fully apparent from the ensuing disclosure and appended claims.

BRIEF DESCRIPTION OF THE DRAWINGS

Specifically, FIG. 1 shows a first step of the method for forming a gate dielectric layer and a gate conductor layer over a semiconductor substrate, according to one embodiment of the present invention.

FIG. 2 shows a second step of the method for patterning the gate conductor layer to form a gate electrode with angled sidewalls, according to one embodiment of the present invention.

FIG. 3 shows a third step of the method for forming source/drain extension regions in the semiconductor substrate by ion implantation, according to one embodiment of the present invention.

FIG. 4 shows a fourth step of the method for forming source/drain spacers along the angled sidewalls of the gate electrode, according to one embodiment of the present invention.

FIG. 5 shows a fifth step of the method for forming source and drain regions in the semiconductor substrate by ion implantation, according to one embodiment of the present invention.

FIG. 6 shows a sixth step of the method for forming metal silicide conductors that contain metal silicide for the gate electrode and the source/drain regions, according to one embodiment of the present invention.

FIG. 7 shows a seventh step of the method for forming a silicon nitride capping layer over the gate electrode and the source/drain regions, according to one embodiment of the present invention.

FIG. 8 shows an eighth step of the method for forming a thick dielectric oxide layer over the silicon nitride capping layer, according to one embodiment of the present invention.

FIG. 9 shows a ninth step of the method for forming source/drain metal contacts with angled sidewalls, according to one embodiment of the present invention.

DETAILED DESCRIPTIONS OF THE INVENTION, AND PREFERRED EMBODIMENTS THEREOF

In the following description, numerous specific details are set forth, such as particular structures, components, materials, dimensions, processing steps and techniques, in order to provide a thorough understanding of the invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" another element, it can be directly on the other element or intervening elements may also be present. In contrast, when an element is referred to as being "directly on" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present invention achieves significant reduction of the gate to source/drain contact metal overlap capacitance, by utilizing a gate electrode with angled sidewalls. The gate electrode of the present invention is characterized by sidewalls that offset from the vertical direction (i.e., the direction that is normal or perpendicular to the substrate surface) by an offset angle ($0 < \alpha \leq 45°$), in such a manner that the top surface area of the gate electrode is smaller than its base surface area.

Further, source/drain metal contacts with angled sidewalls can also be employed by the present invention to achieve further reduction of the gate to source/drain metal contact overlap capacitance. The sidewalls of the source/drain metal contacts are angled in a manner opposite to the gate electrode sidewalls, i.e., so that the top surface area of the source/drain metal contacts is larger, instead of smaller, than the base surface area of such metal contacts.

In the accompanying drawings FIGS. 1–9, various exemplary processing steps of the method of the present invention, as described hereinabove, are illustrated, according to one embodiment of the present invention, for fabrication of an MOSFET device having a gate electrode with angled sidewalls. It is noted that the drawings of the present invention are provided for illustrative purposes only and are not drawn to scale.

Figure 1:
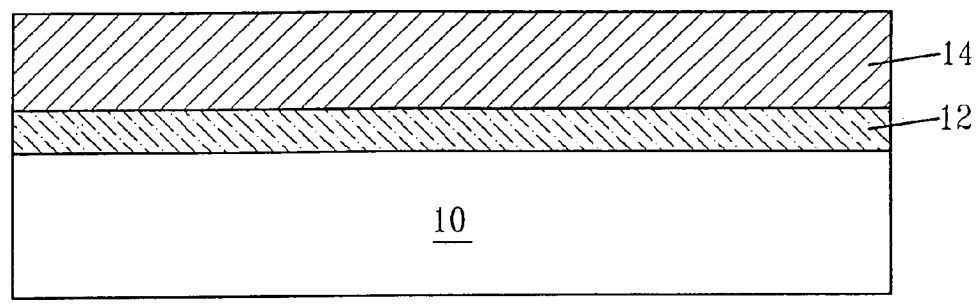
FIGS. 1–9 illustrate, in a step-by-step manner, a method for forming an MOSFET device having a gate electrode with angled sidewalls, according to one embodiment of the present invention.

FIG. 1 shows a structure, which includes a gate conductor comprising a conventionally doped polysilicon layer 14 formed on a thin gate dielectric film 12 (e.g., a gate silicon oxide) that is deposited upon the substrate 10, which comprises a single crystal semiconductor in the form of either a bulk semiconductor layer or a thin film layer of a semiconductor, such as silicon, on an insulating material.

Figure 2:
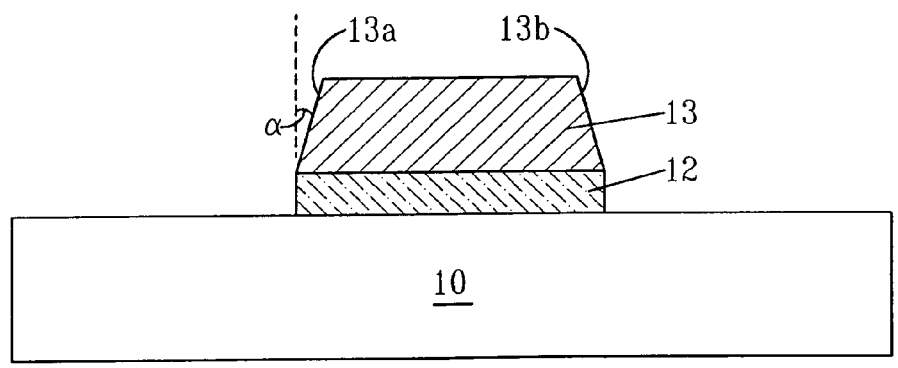

The polysilicon layer 14 of FIG. 1 can be patterned by a conventional process, such as a polysilicon RIE (Reactive Ion Etching) process employing photolithography, as is well understood by those skilled in the art of MOSFET fabrication processes, to form a gate electrode 13 having angled or offset side walls 13a and 13b, as shown in FIG. 2, in such a manner that the top of the gate electrode 13 has a surface area that is smaller than its base. The sidewalls 13a and 13b are offset from the vertical direction, i.e., the direction normal to the substrate surface as indicated by the dotted line, by an angle $\alpha$ that is greater than 0° and less than or equal to about 45°. Preferably, the offset angle $\alpha$ ranges between about 5° to about 30°, more preferably between about 10° to about 20°, and it is most preferably about 15°.

Preferably, but not necessary, thin offset spacers (not shown) are formed along the angled or offset sidewalls 13a and 13b of the gate electrode 13 after the gate patterning step. Alternatively, a reoxidation process can be performed to create a conformal, silicon oxide sidewall layer (not shown) covering the external surfaces of the polysilicon gate electrode 13. If the gate electrode 13 is composed of metal, the reoxidized silicon can be replaced with a silicon oxide layer deposited by a process such as tetraethylorthosilicate-based chemical vapor deposition (CVD TEOS).

Figure 3:
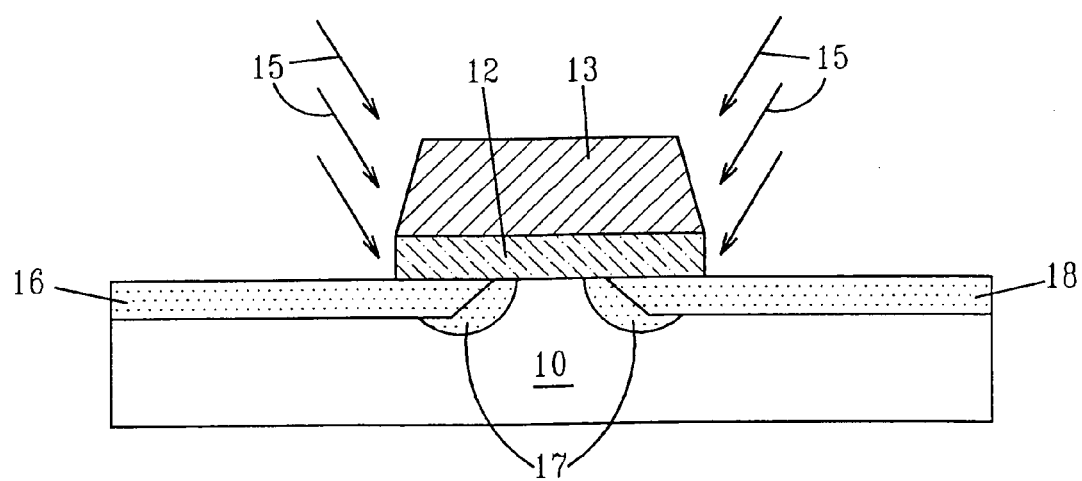

Subsequently, ion implantation 15 can be performed using the angled or offset gate electrode 13 as implant masks to form extension layers 16 and 18 in a self-aligned manner, as shown in FIG. 3. The extension layers 16 and 18 are impurity layers that are formed to produce shallower junctions than the main source/drain layers to be formed later. The extension layers 16 and 18 are of the same conductivity type as the main source/drain layers (to be formed subsequently) and function as source/drain layers; thus, they are referred to herein as source/drain extension layers. The extension layers 16 and 18 may extend more than necessary under the gate structure, due to scattering of impurity ions during implantation and diffusion of impurity ions in a subsequent process.

Preferably, but not necessarily, the implantation 15 is conducted at a predetermined inclined angle relative to the vertical direction, as shown in FIG. 3. In this manner, the extension layers are formed extending at an angle with respect to the substrate surface and have their respective tip portions extending under the gate structure. The inclined angle of the implantation 15 preferably ranges from 0° to 10° with respect to the vertical direction to the substrate surface. In one embodiment, angled ion implantation 15 is applied first from a first angle to form one of the source/drain extension layers 16 and 18, and then from a second angle to form the other of the source/drain extension layers 16 and 18. The angled ion implantation 15 may be accomplished with an ion implantor, which may include an ion beam generator for generating an ion beam. The direction of the ion beam with respect to the wafer substrate can be adjusted either by maintaining the wafer substrate at a certain angle or by adjusting the angle of the ion beam. The implant species, energy level of the ion beam, and/or the duration of the ion beam exposure may be adjusted to achieve optimal implant level.

Thereafter, a halo implant process, preferably an angled halo implant process, can be carried out to form halo implant regions 17 using the gate structure 13 as mask. The inclined angle for the angled halo implant process preferably ranges from 20° to 80° with respect to the vertical direction to the substrate surface.

Figure 4:
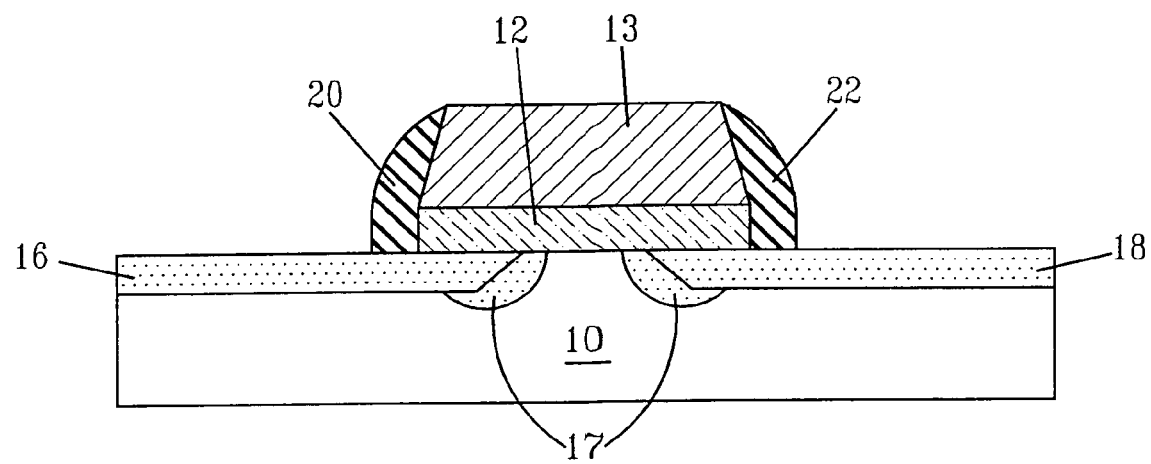

FIG. 4 shows subsequent formation of source/drain spacers 20 and 22 on the angled sidewalls of the gate electrode 15 by conventionally known processing steps, such as CVD and RIE. The source/drain spacers 20 and 22 can comprise any insulating material, such as silicon nitride, silicon dioxide, or silicon oxynitride. Preferably, such source/drain spacers 20 and 22 are formed of silicon nitride.

Figure 5:
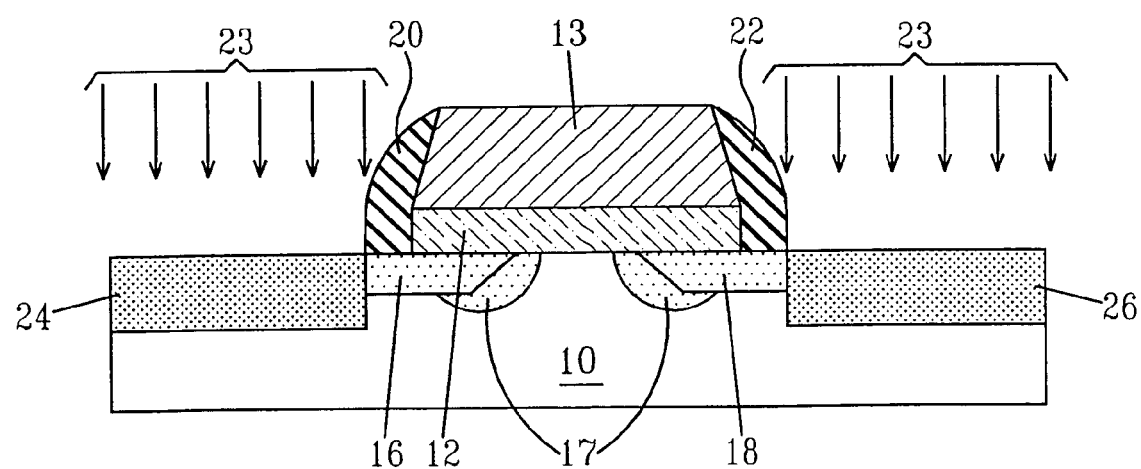

Another ion implantation 23 can then be performed using the angled or offset gate electrode 13 and the source/drain spacers 20 and 22 as implant masks to form source and drain regions layers 24 and 26 in a self-aligned manner, as shown in FIG. 5. The presence of source/drain spacers 20 and 22 effectively prevents formation of overlapping portions between the gate electrode 13 and the source/drain regions 24 and 26.

Figure 6:
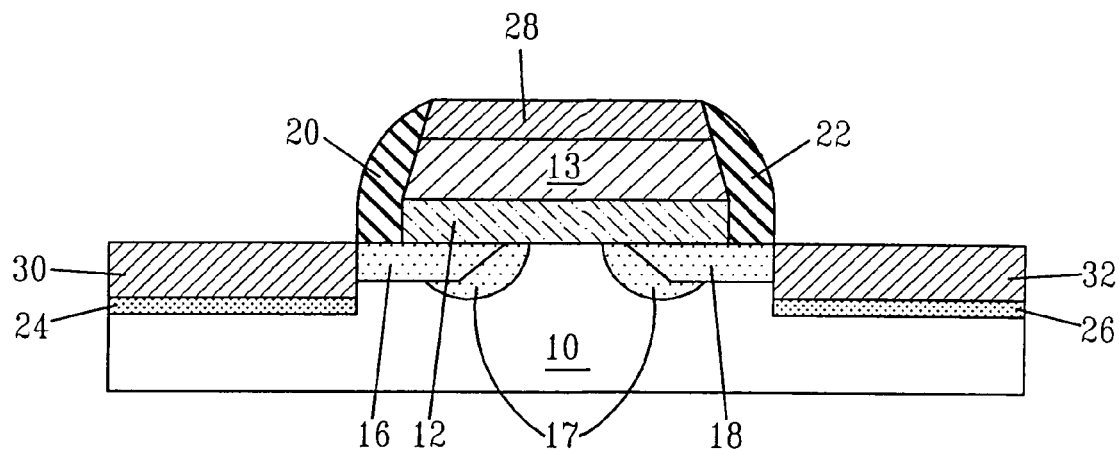

FIG. 6 shows the step for forming metal silicide conductors 28, 30, and 32 over the polysilicon gate electrode 13 and the source/drain regions 24 and 26. The metal silicide layers may be formed of cobalt silicide ($CoSi_2$). In accordance with one embodiment of the present invention, a sputtering step is first performed to form a thin Co layer over the entire structure, followed by a first annealing step carried out at an annealing temperature of about 550° C. for about 30 seconds, where Co reacts with exposed silicon in the source/drain regions 30 and 32 and the gate electrode 28 to form CoSi. Unreacted Co in other regions can then be removed by a wet etching step, and a second annealing step carried out at an annealing temperature of about 800° C. for about 30 seconds results in $CoSi_2$ over the source/drain regions 30 and 32 and the gate electrode 28.

Figure 7:
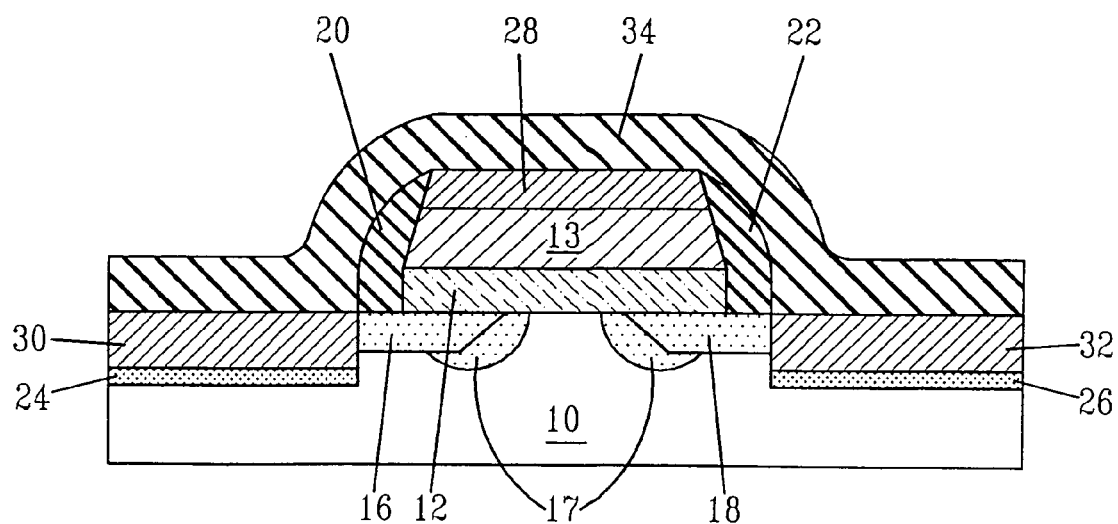

FIG. 7 shows the step for forming a silicon nitride capping layer 28 over the entire structure of FIG. 6. Such a silicon nitride capping layer 28 can be formed by various deposition techniques, such as, for example, plasma-enhanced chemical vapor deposition (PE CVD) process or high density plasma chemical vapor deposition (HDP CVD) process conventional, or any other process commonly used for silicon nitride deposition.

Figure 8:
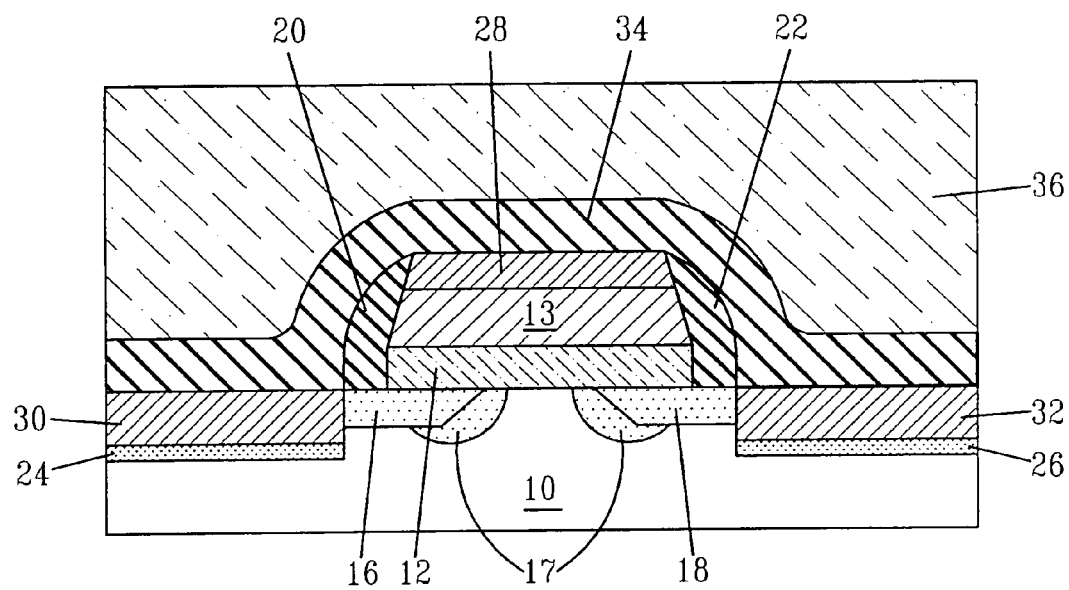
Figure 9:
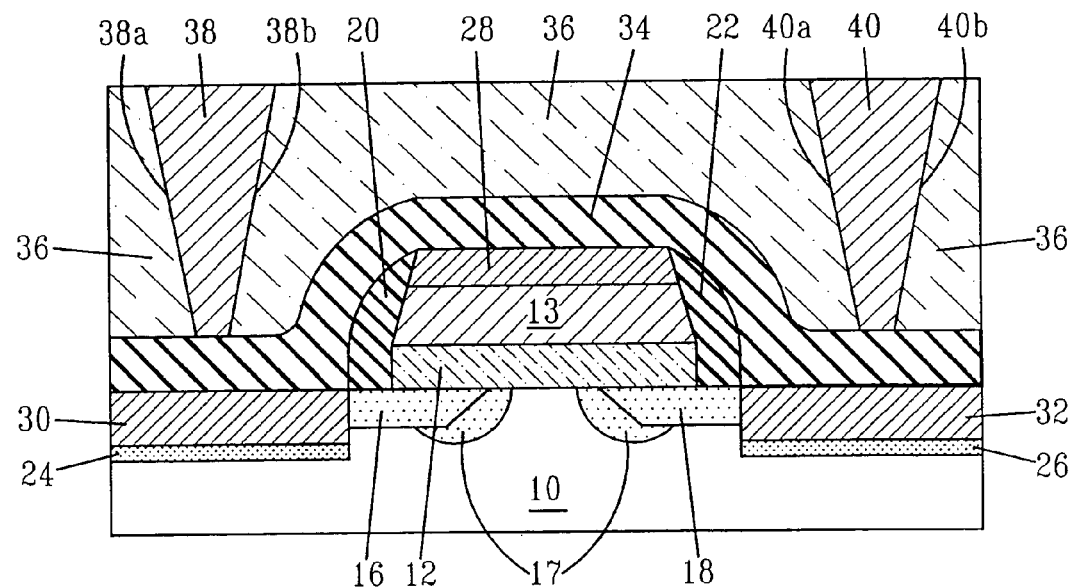

Subsequently, a thick dielectric oxide layer 36 is deposited over the entire structure of FIG. 7 and then planarized, as shown in FIG. 8, and metal contacts 38 and 40 with angled sidewalls 38a, 38b, 40a, and 40b can be formed in the dielectric oxide layer 36 over the source and drain regions 30 and 32, by processing steps including high angle mask opening, metal deposition, and planarization. The sidewalls 38a, 38b, 40a, and 40b of the metal contacts 38 and 40 are offset from the vertical direction by an offset angle greater than 0° and less than or equal to about 45°, preferably greater than about 5° and less than 30°, more preferably greater than 10° and less than about 20°, and most preferably about 15°. The sidewalls 38a, 38b, 40a, and 40b are offset from the vertical direction in a manner opposite to the sidewalls of the gate electrode 13, so that the top surface area of the metal contacts 38 and 40 is larger, instead of smaller, than the respective base surface area of such metal contacts 38 and 40.

The resulting MOSFET device has a significantly reduced overlap capacitance, in comparison with conventional MOSFET devices having straight-walled, i.e., preferably vertical sidewall, gate electrodes. For example, such an MOSFET device has a gate to source metal contact or gate to drain metal contact overlap capacitance of such an MOSFET device is preferably less than 0.07 femtoFarads per micron of channel width.

It should be recognized that some of the processing steps of conventional MOSFET fabrication process have been omitted for brevity and clarity, while some of the conventional MOSFET fabrication steps have been included in the illustration, but these steps do not necessarily form a part of the invention.

While the invention has been described herein with reference to specific embodiments, features and aspects, it will be recognized that the invention is not thus limited, but rather extends in utility to other modifications, variations, applications, and embodiments, and accordingly all such other modifications, variations, applications, and embodiments are to be regarded as being within the spirit and scope of the invention.

What is claimed is:

1. An FET device comprising:
  a semiconductor substrate including source and drain regions;
  a gate dielectric layer located on a top surface of the semiconductor substrate; and
  a conductive gate electrode located on the gate dielectric layer, wherein said conductive gate electrode has a top, a base, and sidewalls, wherein the sidewalls of said conductive gate electrode are offset from a vertical direction by an offset angle that is greater than about 0° and not more than 30°, so that the top of said conductive gate electrode has a surface area smaller than that of the base.

2. An FET device comprising:
  a semiconductor substrate including source and drain regions;
  a gate dielectric layer located on a top surface of the semiconductor substrate; and
  a conductive gate electrode located on the gate dielectric layer, wherein said conductive gate electrode has a top, a base, and sidewalls, wherein the sidewalls of said conductive gate electrode are offset from a vertical direction by an offset angle that ranges from about 10° to about 20°, so that the top of said conductive gate electrode has a surface area smaller than that of the base.

3. The FET device of claim 2, further comprising a source extension region and a drain extension region in the semiconductor substrate.

4. The FET device of claim 2, further comprising a source/drain spacer along each of the sidewalls of the conductive gate electrode.

5. The FET device of claim 2, further comprising metal silicide conductors for the gate electrode, the source region, and the drain region.

6. The FET device of claim 2, wherein the conductive gate electrode comprises polysilicon.

7. The FET device of claim 2, further comprising a capping layer formed over the conductive gate electrode, the source region, and the drain region.

8. The FET device of claim 7, wherein the capping layer comprises silicon nitride.

9. The FET device of claim 2, further comprising metal contacts for the source and drain regions, wherein each of said metal contacts has a top, a base, and sidewalls, wherein the sidewalls of each metal contact are offset from a vertical direction by an offset angle that is greater than about 0° and not more than about 45°, so that the top of said metal contact has a surface area larger than that of the base.

10. The FET device of claim 2, having a gate to drain metal contact overlap capacitance that is less than 0.07 femtoFarads per micron of channel width.

11. An FET device comprising a conductive gate electrode with angled sidewalls that are characterized by an offset angle that is greater than about 0° and not more than 30° with respect to a vertical direction.

12. The FET device of claim 11, wherein the offset angle ranges from about 10° to about 20°.

* * * * *